United States Patent
Wang et al.

(10) Patent No.: US 9,099,999 B1
(45) Date of Patent: Aug. 4, 2015

(54) ADJUSTABLE DRIVE STRENGTH INPUT-OUTPUT BUFFER CIRCUITRY

(75) Inventors: Bonnie I. Wang, Cupertino, CA (US); Chiakang Sung, Milpitas, CA (US); Joseph Huang, Morgan Hill, CA (US); Khai Nguyen, San Jose, CA (US); Tony Ngai, Saratoga, CA (US); Zhe Li, San Jose, CA (US); Hong Shi, Fremont, CA (US)

(73) Assignee: Altera Corporation, San Jose, CA (US)

( * ) Notice: Subject to any disclaimer, the term of this patent is extended or adjusted under 35 U.S.C. 154(b) by 15 days.

(21) Appl. No.: 13/485,768

(22) Filed: May 31, 2012

(51) Int. Cl.
| | |
|---|---|
| *H01L 29/73* | (2006.01) |
| *H01L 29/40* | (2006.01) |
| *H03K 17/00* | (2006.01) |
| *H05K 1/18* | (2006.01) |
| *H01L 25/065* | (2006.01) |
| *H01L 27/06* | (2006.01) |

(52) U.S. Cl.
CPC ............ *H03K 17/00* (2013.01); *H05K 1/181* (2013.01); *H01L 25/0652* (2013.01); *H01L 25/0657* (2013.01); *H01L 27/0688* (2013.01)

(58) Field of Classification Search
CPC ............ H01L 25/0657; H01L 25/0655; H01L 27/0688; H01L 257/209; H01L 257/777
USPC .................................................. 257/209, 777
See application file for complete search history.

(56) References Cited

U.S. PATENT DOCUMENTS

| | | | |
|---|---|---|---|
| 5,994,166 A * | 11/1999 | Akram et al. ................. | 438/108 |
| 6,617,891 B2 * | 9/2003 | Srikanth et al. ............... | 327/108 |
| 6,807,109 B2 | 10/2004 | Tomishima | |
| 7,626,423 B1 * | 12/2009 | Li et al. ............................ | 326/86 |
| 7,930,661 B1 * | 4/2011 | Trimberger et al. .......... | 716/104 |
| 2007/0240083 A1 | 10/2007 | Hiroi et al. | |
| 2010/0276572 A1 | 11/2010 | Iwabuchi et al. | |
| 2011/0074466 A1 * | 3/2011 | Pedersen et al. ................ | 326/94 |
| 2012/0068229 A1 | 3/2012 | Bemanian et al. | |
| 2013/0181257 A1 * | 7/2013 | Ngai ............................ | 257/209 |

OTHER PUBLICATIONS

"3D ICs with TSVs-Design Challenges and Requirements," Cadence Design Systems, 2011.

* cited by examiner

*Primary Examiner* — Thanh V Pham
(74) *Attorney, Agent, or Firm* — Treyz Law Group; Jason Tsai

(57) ABSTRACT

An integrated circuit in a multi-chip package is provided. The integrated circuit may include adjustable interface circuitry configured to interface with other off-chip components. In particular, the adjustable interface circuitry may include a microbump input-output buffer operable to drive signals off of the integrated circuit and operable to receive signals from other integrated circuits in the multi-chip package via a microbump. The microbump input-output buffer may include output buffers and input buffers. The output buffers may have programmable drive strengths and may each be selectively switched in and out of use depending on the desired application. Each output buffer may include a level shifter, a buffer circuit, and multiple inverter-like circuits each of which can be turned on or off to adjust the drive strength of that output buffer.

14 Claims, 8 Drawing Sheets

ADJUSTABLE DRIVE STRENGTH INPUT-OUTPUT BUFFER CIRCUITRY

BACKGROUND

An integrated circuit package generally includes, among others, an integrated circuit die and a substrate on which the die is mounted. The die is typically coupled to the substrate through wires or solder bumps. Signals from the integrated circuit die may then travel through the wires or solder bumps to the substrate.

As integrated circuit technology scales towards smaller device dimensions, device performance continues to improve at the expense of increased power consumption. In an effort to reduce power consumption, more than one die may be placed within a single integrated circuit package (i.e., a multi-chip package). As different types of devices cater to different types of applications, more dies may be required in some systems to meet the requirements of high performance applications. Accordingly, to obtain better performance and higher density, an integrated circuit package may include multiple dies arranged laterally along the same plane or may include multiple dies stacked on top of one another.

Each die within a multi-chip package may include input-output buffer circuits configured to drive output signals from one die to another and to receive incoming signals from another die. Such types of input-output buffer circuits typically exhibit fixed drive strengths.

SUMMARY

Multiple integrated circuit dies may be mounted within a single integrated circuit package (sometimes referred to as a multi-chip package). A multi-chip package may include multiple dies that are stacked horizontally with respect to one another and/or multiple dies that are stacked vertically on top of one another. In particular, horizontally stacked dies may be interconnected through associated microbumps and signal paths formed in an interposer structure on which the horizontally stacked dies are mounted, whereas vertically stacked dies may be interconnected through associated microbumps and through-silicon vias (TSVs) that are formed in the die substrates. The interposer structure may be coupled to a package substrate through bumps (sometimes referred to as flip-chip bumps).

An integrated circuit may include adjustable interface circuitry configured to communicate with other dies within the same multi-chip package and with other off-package components. The adjustable interface circuitry may include microbump input-output buffer circuits, flip-chip bump input-output buffer circuits, and an interface control circuit that can be used to control the drive strengths of at least some of the input-output buffer circuits. The microbump buffer circuits are generally used to drive output signals and receive input signals via associated microbumps on the integrated circuit, whereas the flip-chip bump buffer circuits are generally used to drive output signals and receive input signals via associated bumps on the integrated circuit.

A microbump buffer circuit may include input buffer circuits and output buffer circuits. The input buffer circuits may include buffer circuits formed using different gate oxide thicknesses. The different input buffer circuits may be individually switched in or out of use depending on the current application. The output buffer circuits may also include buffer circuits formed using different gate oxide thicknesses. For example, a first output buffer that is configured to drive output signals with a signal swing of 1.5 V may be formed using transistors with a thick gate oxide (e.g., a gate oxide layer with thicknesses of about 15-30 angstroms), whereas a second output buffer that is configured to drive output signals with a signal swing of 1.0 V may be formed using transistors which a thin gate oxide (e.g., a gate oxide layer with thicknesses of about 15-30 angstroms). Each of the output buffers may be switched in or out of use by using pass gates, by intentionally not forming particular metal paths during die fabrication procedures, or by the use of other programmable switching mechanisms.

An output buffer may include a level shifter and a buffer coupled in series and multiple inverter-like (driver) circuits that are coupled to the buffer's output. The level shifter and buffer may collectively serve to boost the signal swing of the signals that are to be output through the corresponding microbump. The inverter-like circuits may receive controls from the interface control circuit that control whether each of the inverter-like circuits is placed in an active mode or a tri-state (idle) mode. When a higher drive strength is desired for the output buffer, the interface control circuit will generate control signals that activate a larger portion of the inverter-like circuits. When a relatively lower drive strength is desired for the output buffer, the interface control circuit will generate control signals activate a relatively smaller portion of the inverter-like circuits. The drive strengths associated with each of the output buffers can be individually programmed in this way using the interface control circuit. If desired, the flip-chip input-output buffer circuits may also be equipped with adjustable drive strength capability.

Further features of the present invention, its nature and various advantages will be more apparent from the accompanying drawings and the following detailed description.

DETAILED DESCRIPTION

Figure 1:
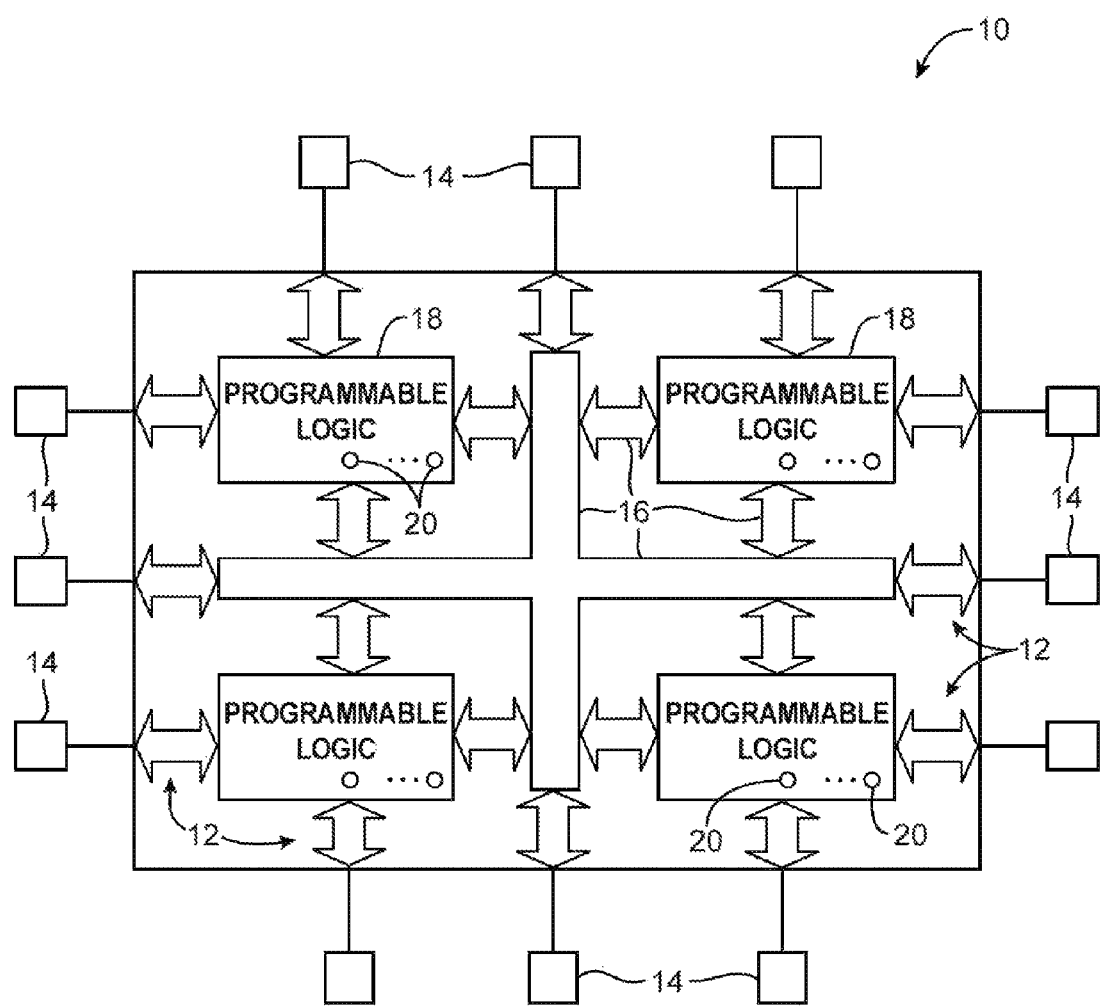
FIG. 1 is a diagram of an illustrative programmable integrated circuit in accordance with an embodiment of the present invention.

An illustrative integrated circuit of the type that may be provided with memory elements and associated circuits that can be controlled using output signals from the memory elements is shown in FIG. 1. As shown in FIG. 1, integrated circuit 10 may contain memory elements 20. Memory elements 20 may be loaded with configuration data to configure programmable transistors such as pass transistors (sometimes referred to as pass gates or pass gate transistors) in programmable circuitry (programmable logic) 18.

Because memory elements 20 may be used in storing configuration data for programmable logic 18, memory elements 20 may sometimes be referred to as configuration random-access memory elements (CRAM). Integrated circuit 10 may be configured to implement custom logic functions by configuring programmable logic 18. As a result, integrated circuit 10 may sometimes be referred to as a programmable integrated circuit.

As shown in FIG. 1, programmable integrated circuit 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 may include fixed interconnects (conductive lines) and programmable interconnects (i.e., programmable connections between respective fixed interconnects).

Programmable logic 18 may include combinational and sequential logic circuitry. Programmable logic 18 may be configured to perform a custom logic function. The programmable interconnects associated with interconnection resources 16 may be considered to form a part of programmable logic 18.

When memory elements 20 are loaded with configuration data, the memory elements each provide a corresponding static control output signal that controls the state of an associated logic component in programmable logic 18. The memory element output signals may, for example, be used to control the gates of metal-oxide-semiconductor (MOS) transistors such as n-channel metal-oxide-semiconductor (NMOS) pass transistors in programmable components such as multiplexers, logic gates such as AND gates, OR gates, XOR gates, NAND gates, NOR gates, etc. P-channel transistors (e.g., a p-channel metal-oxide-semiconductor pass transistor) may also be controlled by output signals from memory elements 20, if desired.

When a memory element output that is associated with an NMOS pass transistor is high, the pass transistor controlled by that memory element is turned on and passes logic signals from its input to its output. When the memory element output is low, an NMOS pass transistor is turned off and does not pass logic signals. P-channel metal-oxide-semiconductor (PMOS) pass transistors are turned on when the signal that is applied to its gate from the output of a memory element is low (e.g., 0 volts) and are turned off when the output of the memory element is high (i.e., the polarity for NMOS and PMOS control signals is reversed).

Configuration random-access memory elements 20 may be arranged in an array pattern. There may be, for example, millions of memory elements 20 on integrated circuit 10. During programming operations, the array of memory elements is provided with configuration data. Once loaded with configuration data, memory elements 20 may selectively control (e.g., turn on and off) portions of the circuitry in the programmable logic 18 and thereby customize the circuit functions of circuit 10.

The circuitry of programmable integrated circuit 10 may be organized using any suitable architecture. As an example, the circuitry of programmable integrated circuit 10 may be organized in a series of rows and columns of programmable logic blocks (regions) each of which contains multiple smaller logic regions. The logic resources of integrated circuit 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the circuitry of programmable integrated circuit 10 may be arranged in more levels or layers in which multiple large regions are interconnected to form still larger portions of logic. Still other device arrangements may use logic that is not arranged in rows and columns.

The example of FIG. 1 in which device 10 is described as a programmable integrated circuit is merely illustrative and does not serve to limit the scope of the present invention. The method and apparatus described herein may be incorporated into any suitable circuit. For example, the method and apparatus may also be incorporated into numerous types of devices such as microprocessors, digital signal processors, application specific standard products (ASSPs), application specific integrated circuits (ASICs), programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), just to name a few.

As integrated circuit fabrication technology scales towards smaller process nodes, it becomes increasingly challenging to design an entire system on a single integrated circuit die (sometimes referred to as a system-on-chip). Designing analog and digital circuitry to support desired performance levels while minimizing leakage and power consumption can be extremely time consuming and costly.

One alternative to single-die packages is an arrangement in which multiple dies are placed within a single package. Such types of packages that contain multiple interconnected dies may sometimes be referred to as systems-in-package (SiPs), multi-chip modules (MCM), or multi-chip packages. Placing multiple chips (dies) into a single package may allow each die to be implemented using the most appropriate technology process (e.g., a memory chip may be implemented using the 28 nm technology node, whereas the radio-frequency analog chip may be implemented using the 90 nm technology node), may increase the performance of die-to-die interface (e.g., driving signals from one die to another within a single package is substantially easier than driving signals from one package to another, thereby reducing power consumption of associated input-output buffers), may free up input-output pins (e.g., input-output pins associated with die-to-die connections are much smaller than pins associated with package-to-board connections), and may help simplify printed circuit board (PCB) design (i.e., the design of the PCB on which the multi-chip package is mounted during normal system operation).

Figure 2:
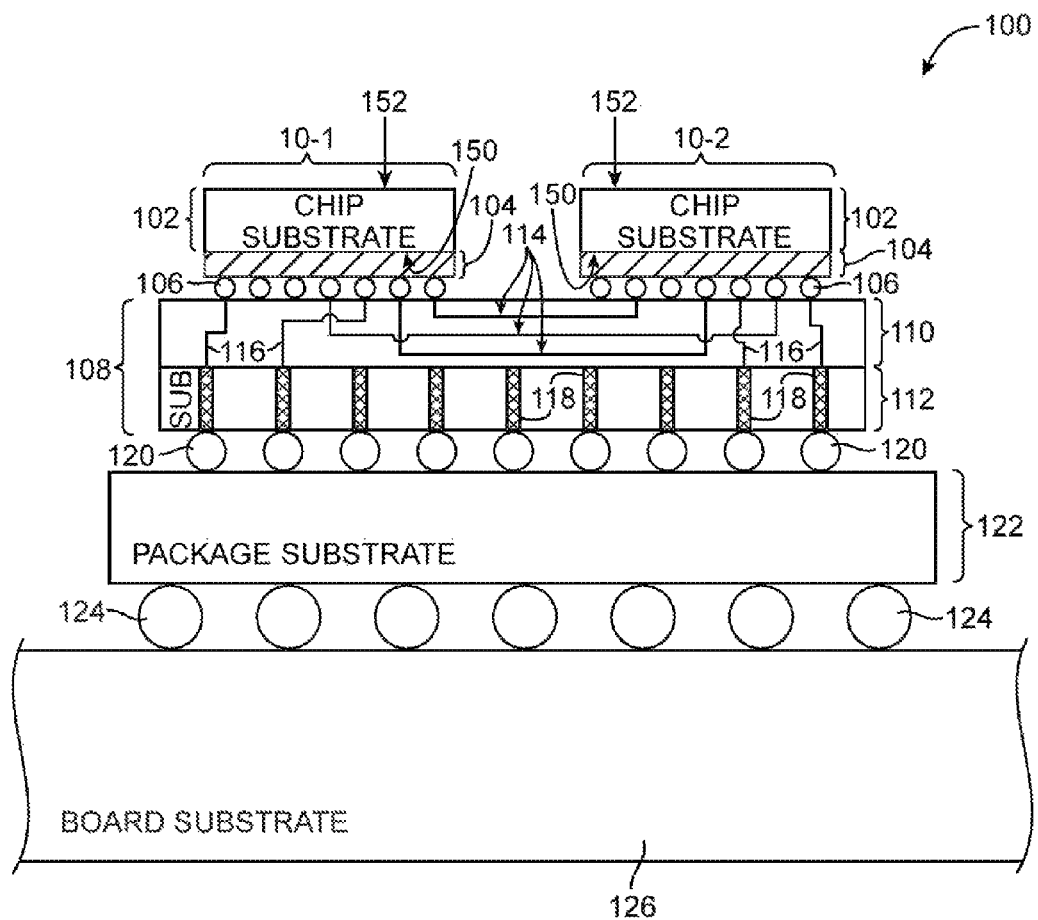
FIG. 2 is a cross-sectional side view of an illustrative multi-chip package having two dies that are arranged laterally along the same plane in accordance with an embodiment of the present invention.

FIG. 2 is a cross-sectional side view of an illustrative multi-chip package 100. Multi-chip package 100 may include a package substrate such as package substrate 122, an interposer structure such as interposer 108 that is mounted on top of package substrate 122, and multiple dies mounted on top of interposer 108. As shown in FIG. 2, a first integrated circuit die 10-1 and a second integrated circuit die 10-2 may be mounted on top of interposer 108. Each die 10 (i.e., dies 10-1 and 10-2) may include a semiconductor substrate 102 (e.g., a p-type silicon substrate) having a first surface 150, a second surface 152, and interconnect layers 104 formed on the first surface 150 of substrate 102. Device structures such as transistor gate structures, capacitor plate structures, resistive load structures, and density-compliance structures may be formed at the interface where interconnect layers 104 meet surface 150. Interconnect layers 104 (sometimes referred to collectively as a dielectric stack) may include alternating layers of metal routing layers (e.g., dielectric layers in which metal routing paths can be formed) and via layers (e.g., dielectric layers through which metal vias can be formed for electrically connecting paths from one metal routing layer to paths in another metal routing layer).

Surface 150 on which interconnect layers 104 are formed is typically referred to as the upper surface of substrate 102. The configuration as shown in FIG. 2 in which surface 150 is facing downwards towards package substrate 122 is therefore sometimes referred to as a flip-chip configuration, because each die 10 is inverted/flipped from its upright orientation.

Dies 10-1 and 10-2 may be coupled to interposer 108 via microbumps 106. Microbumps 106 may refer to solder bumps that are formed on the uppermost layer of interconnect stack 104 and may each have a diameter of 10 μm (as an example). In particular, microbumps 106 are deposited on microbump pads that are formed in the uppermost layer of interconnect stack 104. Interposer 108 may include interposer routing layers 110 formed over interposer substrate 112 (e.g., a silicon carrier substrate). Die 10-1 may be coupled to die 10-2 via signal routing paths 114 formed in interposer routing layers 110 (e.g., microbumps 106 that are associated with die 10-1 may be electrically coupled to microbumps 106 that are associated with die 10-2 via interposer routing paths 114).

Interposer 108 may be coupled to package substrate 122 via bumps 120. Bumps 120 that interface directly with package substrate 122 may sometimes be referred to as controlled collapse chip connection (C4) bumps or flip-chip bumps and may each have a diameter of 100 μm (as an example). Flip-chip bumps 120 may refer to solder bumps that are formed on flip-chip bump pads that are formed in the uppermost layer of interconnect stack 104. Generally, flip-chip bumps 120 (e.g., bumps used for interfacing with off-package components) are substantially larger in size relative to microbumps 106 (e.g., bumps used for interfacing with other dies within the same package). Bumps 120 may be coupled to dies 10-1 and 10-2 through via paths 116 that are formed in interposer routing layers 110 and through-silicon vias (TSVs) 118 that are formed in interposer substrate 112. Interposer through-silicon vias 118 may be formed from copper, tungsten, aluminum, or other suitable conductive materials, may have diameters ranging from 1-10 μm, and may have lengths that are equal to the thickness of interposer substrate 112 (e.g., lengths ranging from 10-100 μm, depending on the thickness of substrate 112).

Package substrate 122 may be coupled to board substrate 126 via solder balls 124. As an example, solder balls 124 may form a ball grid array (BGA) configuration for interfacing with corresponding conductive pads on substrate 126. Substrate 126 may be a printed circuit board (PCB) on which multi-chip package 100 and other single-chip or multi-chip packages may be mounted. The exemplary configuration of FIG. 2 in which two laterally positioned dies are interconnected via an interposer structure 108 may sometimes be referred to as 2.5-dimensional ("2.5D") stacking. If desired, more than two laterally (horizontally) positioned dies may be mounted on top of interposer structure 108 and may be interconnected via paths 114 formed in interposer routing layers 110.

Figure 3:
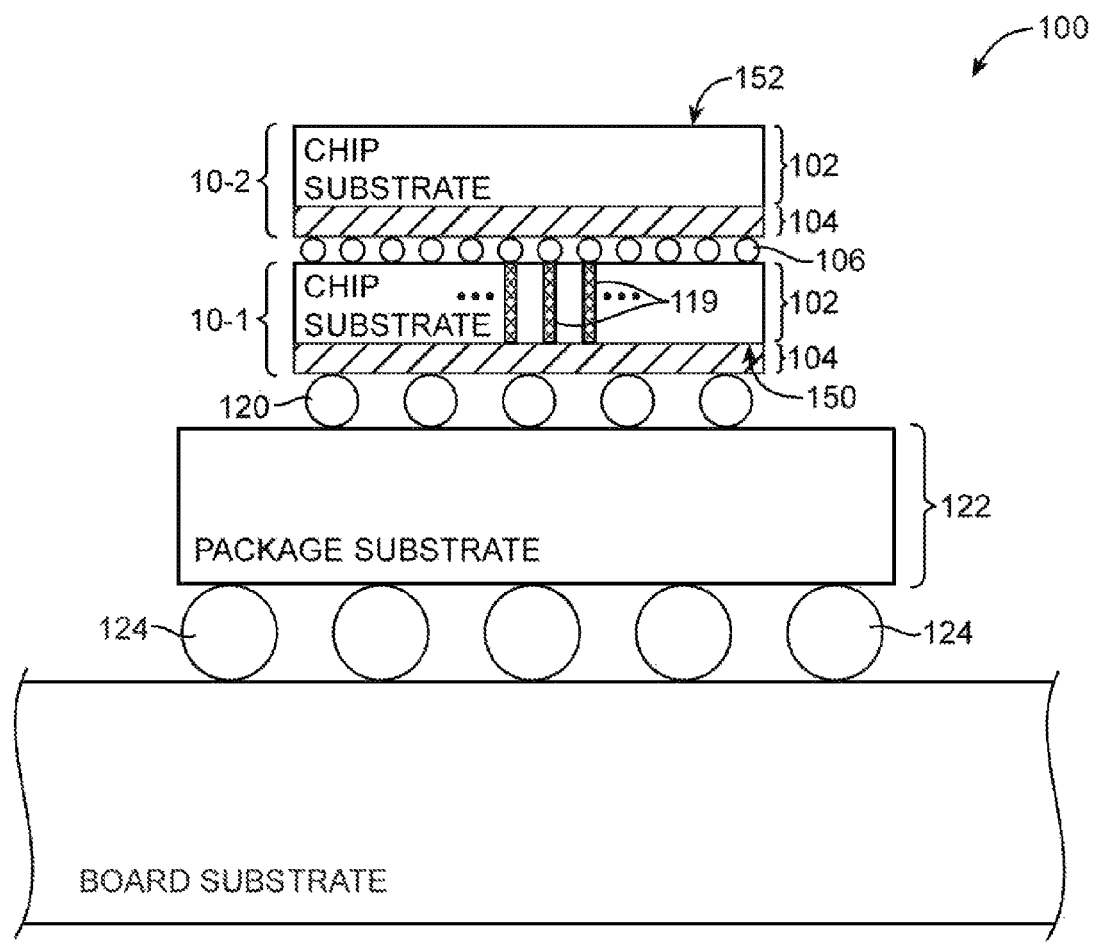
FIG. 3 is a cross-sectional side view of an illustrative multi-chip package having two dies that are stacked on top of one another in accordance with an embodiment of the present invention.

In another suitable arrangement, multiple dies may be stacked vertically on top of one another (see, e.g., FIG. 3). As shown in FIG. 3, die 10-2 may be stacked on top of die 10-1. This type of configuration in which dies are stacked vertically on top of one another may sometimes be referred to as "3D" stacking. Through-silicon vias 119 may be formed through substrate 102 of die 10-1. Through-silicon vias 119 that are formed through chip substrate 102 may therefore sometimes be referred to as chip TSVs (or die TSVs). In this way, device structures associated with die 10-1 may communicate with device structures associated with die 10-2 by sending data/control signals through vias 119 and microbumps 106 (i.e., microbumps 106 formed at the interface between the two vertically stacked dies).

The arrangement of FIG. 3 in which the "back" surface 152 of die 10-1 is attached to the front "face" 150 of die 10-2 is sometimes referred to as a back-to-face (B2F) configuration. In other suitable embodiments, multi-chip package 100 may be formed using a back-to-back (B2B) configuration (e.g., a configuration in which back surface 152 of die 10-1 is facing back surface 152 of die 10-2, where through-silicon vias are formed in substrate 102 of both dies 10-1 and 10-2) or a face-to-face (F2F) configuration (e.g., a configuration in which the front face 150 of die 10-1 is adjacent to the front face 150 of die 10-2).

Figure 4:
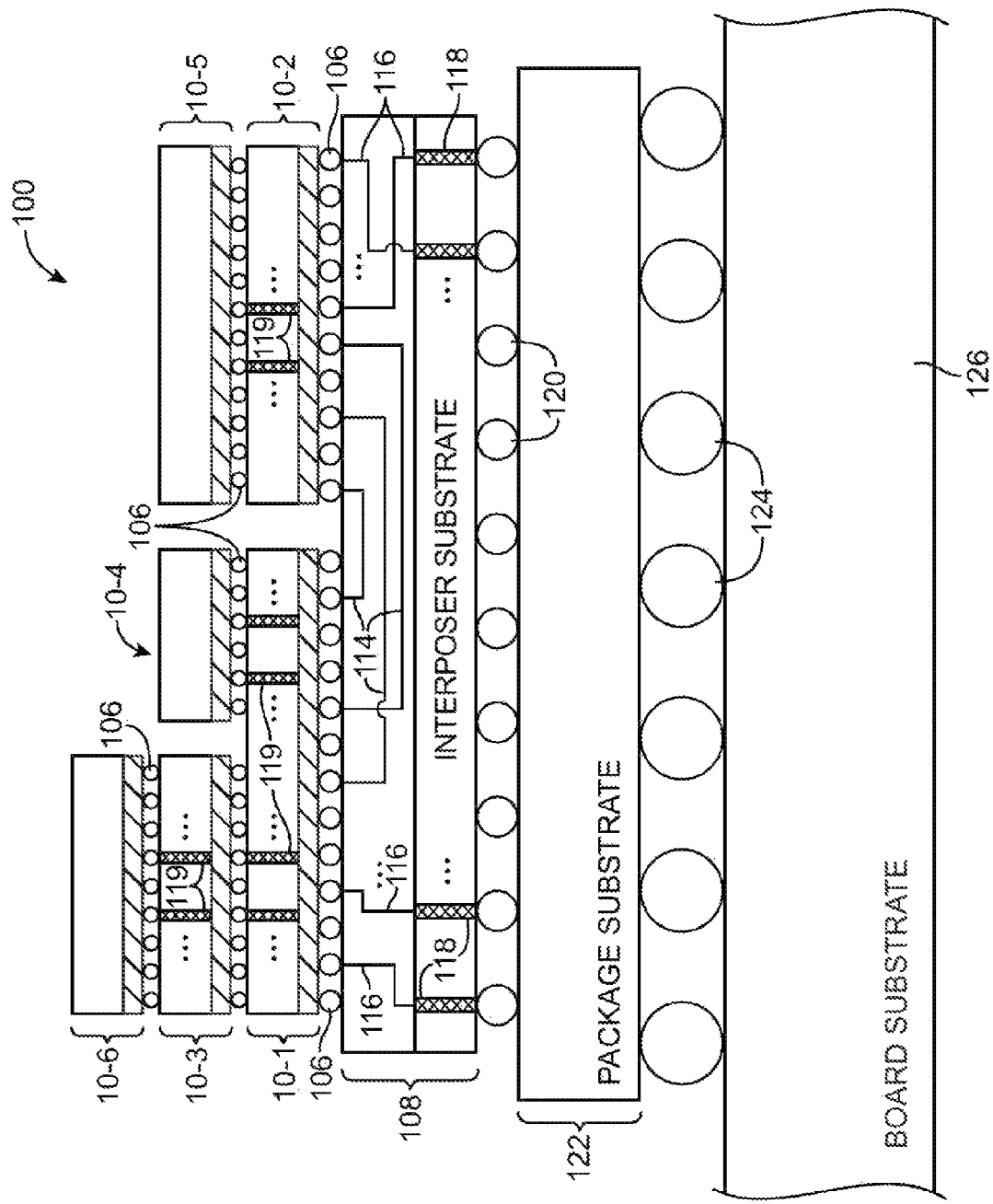
FIG. 4 is a cross-sectional side view of an illustrative multi-chip package having dies that are arranged laterally along the same plane and dies that are stacked on top of one another in accordance with an embodiment of the present invention.

In general, multi-chip package 100 may include any number of dies stacked on top of one another and dies arranged laterally with respect to one another (see, e.g., FIG. 4). As shown in FIG. 4, dies 10-1 and 10-2 may be mounted on interposer 108, dies 10-3 and 10-4 may be stacked on top of die 10-1, die 10-5 may be stacked on top of die 10-2, and die 10-6 may be stacked on top of die 10-3. In general, vertically stacked dies may be coupled to one another though TSVs 119.

As an example, die 10-1 may be a programmable integrated circuit, die 10-2 may be a memory device, die 10-3 may be a micro-electromechanical (MEM) device, die 10-4 may be a radio-frequency transceiver device, and dies 10-5 and 10-6 may be other types of integrated circuits. The multi-chip package arrangements as shown in FIGS. 2, 3, and 4 are merely illustrative and do not serve to limit the scope of the present invention. If desired, multi-chip package 100 may include any number of dies that are interconnected using interposer 108 and/or through-silicon vias 119 that are formed in at least some of chip substrates 102. In general, dies that are part of a multi-chip package 100 may be contained within a housing that is molded from plastic, resin, ceramic, or other suitable materials.

Figure 5:
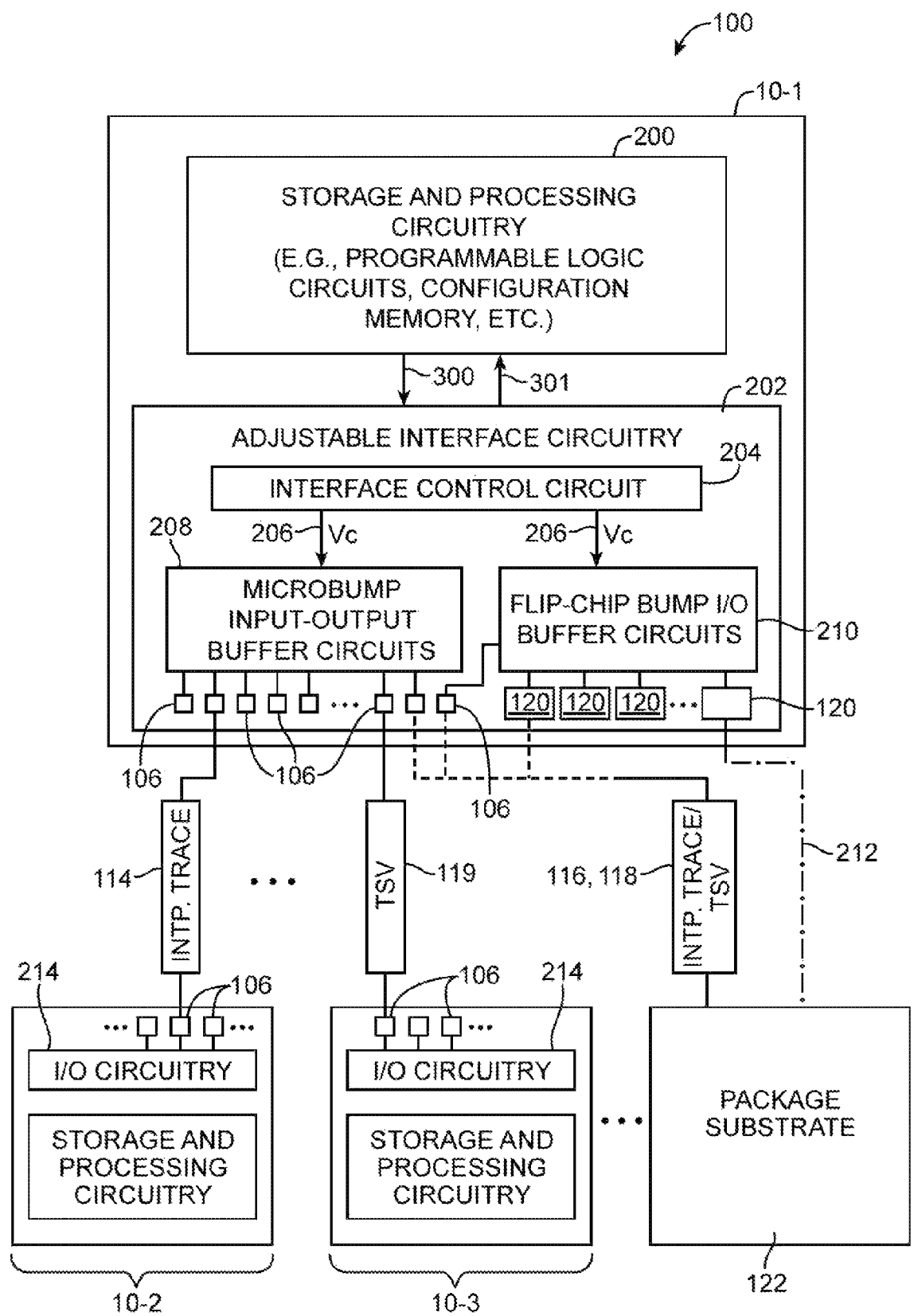
FIG. 5 is a diagram showing how a die in a multi-chip package may be coupled to other dies in the multi-chip package and may include microbump input-output buffer circuits in accordance with an embodiment of the present invention.

FIG. 5 is a diagram showing how a die in a multi-chip package may be coupled to other dies in the multi-chip package. As shown in FIG. 5, die 10-1 may be coupled to die 10-1, die 10-2 and package 122. Die 10-1 may include storage and processing circuitry such as storage and processing circuitry 200 and adjustable interface circuitry 202. Storage and processing circuitry 200 may include one or more different types of storage such as nonvolatile memory (e.g., flash memory or other electrically-programmable-read-only memory), volatile memory (e.g., static or dynamic random-access-memory, sometimes referred to as configuration memory), data registers, and/or other suitable types of memory. Storage and processing circuitry 200 may also include logic circuits such as combinatorial logic circuits and sequential logic circuits, digital signal processing modules, radio-frequency processing modules (e.g., wireless communications circuitry such as baseband circuits, power amplifiers, low noise amplifiers, filters, etc.), power management circuits, control circuits such as lookup tables, multiplexers, encoders/decoders, counters, adders, multipliers, arithmetic logic circuits, programmable logic circuits, etc. Circuitry 200 may also include control circuitry operable to control the interaction among the different circuitry on die 10-1 and other suitable digital and analog processing circuits. Dies 10-2 and 10-3 and other dies within multi-chip package 100 may also include such types of storage and processing circuitry.

Adjustable interface circuitry 202 may include driver circuits configured to drive signals off of die 10-1 such as microbump input-output buffer (driver) circuits 208 and flip-chip bump input-output buffer circuits 210. Buffer circuits 208 may be used for driving output signals and receiving input signals through microbumps 106, whereas buffer circuits 210 may generally be used for driving output signals and receiving input signals through flip-chip bumps 120. The operation of I/O buffer circuits 208 and 210 may be controlled using interface control circuit 204 by sending control signals Vc via control path 206. For example, interface control circuit 204 may be configured to program some of buffer circuits 208 so that they exhibit a first drive strength while programming other buffer circuits 208 to exhibit a second drive strength that differs from the first drive strength. In one suitable embodiment, signals Vc may be digital control bits that are stored in volatile or non-volatile memory cells on device 10-1.

Die 10-1 may be coupled to die 10-2 that is horizontally stacked adjacent to die 10-1. For example, dies 10-1 and 10-2 may both be mounted on an interposer carrier 108 and may therefore be interconnected via interposer traces 114 and microbumps 106 (e.g., interface circuitry 202 of die 10-1 may be coupled to input-output circuitry 214 of die 10-2 via interposer traces 114 and microbumps 106). If desired, die 10-1 may be coupled to any number of dies that are directly mounted on interposer 108 through interposer traces 114 and microbump connections 106.

Die 10-1 may be coupled to die 10-3 that is vertically stacked with respect to die 10-1. For example, die 10-3 may be stacked on top of 10-1 and may therefore be interconnected via chip TSVs 119 and microbumps 106 (e.g., interface circuitry 202 of die 10-1 may be coupled to input-output circuitry 214 of die 10-3 via die TSVs 119 and microbumps 106). If desired, any number of dies may be stacked on top of die 10-1 and may be coupled to die 10-1 via TSVs 118 and microbump connections 106.

In scenarios where no interposer 108 is present (e.g., where all other dies in multiple-chip package 100 are stacked over die 10-1), die 10-1 may be coupled to package substrate 122 directly via flip-chip bumps 120 (as shown by dotted path 212). In scenarios in which an interposer 108 is present (e.g., scenarios where die 10-1 and at least one other die are stacked horizontally with respect to each other), die 10-1 may be coupled to package substrate 122 via interposer traces 116 and interposer TSVs 118 (see, e.g., FIGS. 2 and 4). Die 10-1 may drive output signals to package substrate 122 using I/O buffer circuits 208 via microbumps 106, using I/O buffer circuits 210 via microbumps 106, and/or using I/O buffer circuits 210 via flip-chip bumps 120. Generally, buffer circuits 210 are used to drive signals off-package over long distances (e.g., over board traces that are substantially longer than intra-package interposer traces 114) and may therefore be substantially larger in size relative to buffer circuits 208 (which are generally used for driving signals from one die to another within a single multi-chip package).

In general, adjustable interface circuitry 202 and the I/O circuitry 214 of dies 10-2 and 10-3 may also include other input-output circuits such as phase alignment circuits configured to receive signals from other devices via the input-output pins, electrostatic discharge (ESD) protection circuitry configured to limit the amount of electrostatic current that flows through the input-output pins for preventing damage due to electrostatic discharge events, decoupling capacitor circuitry configured to serve as an energy reserve during dynamic switching operations (e.g., to help provide more stable power supply voltages), etc.

Figure 6:
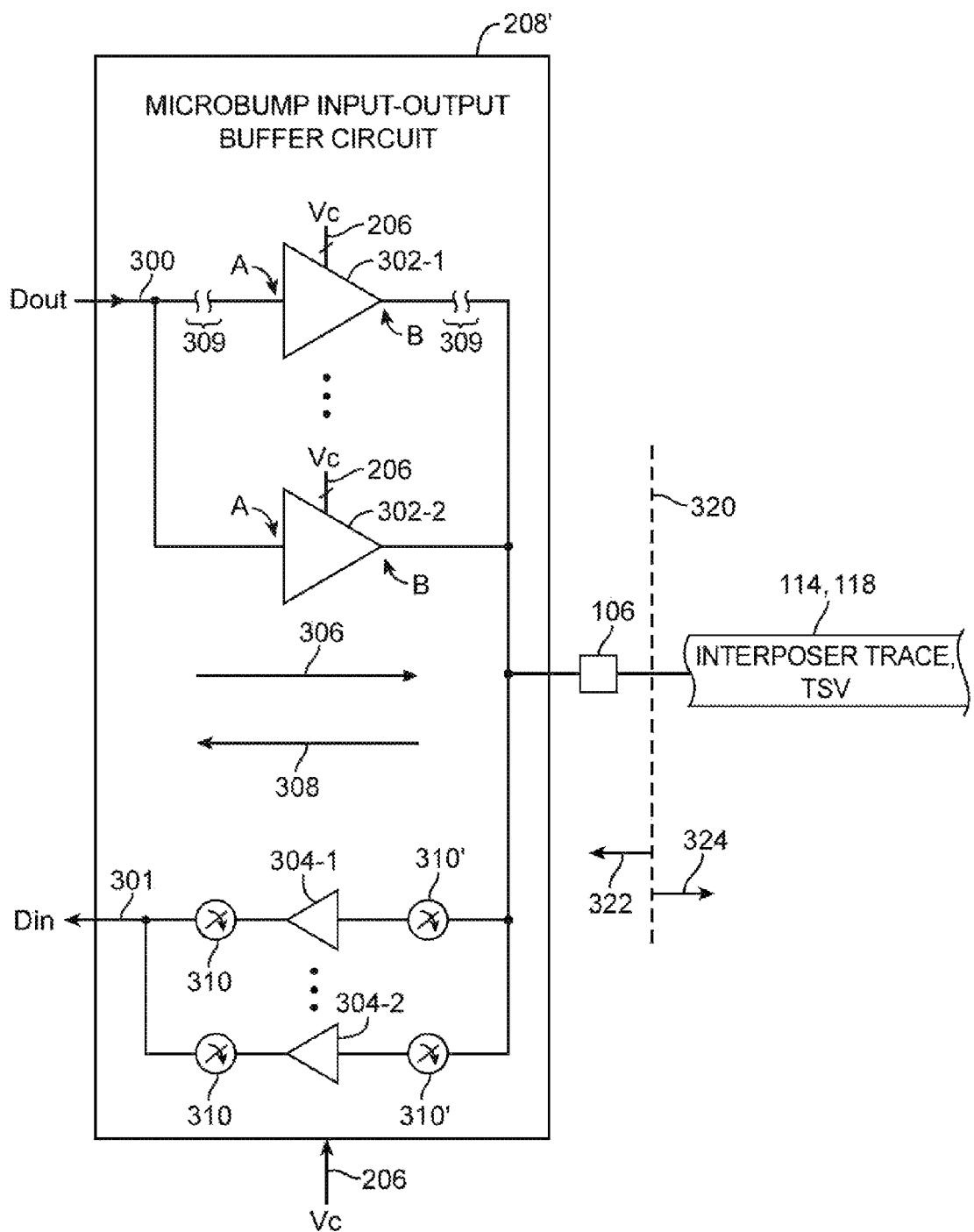
FIG. 6 is a diagram of an illustrative microbump input-output buffer circuit in accordance with an embodiment of the present invention.

FIG. 6 is a circuit diagram of an illustrative microbump input-output buffer circuit 208'. Each microbump 106 on die 10-1 may be coupled to an associated buffer circuit 208'. Circuitry to the left of dotted line 320 (as indicated by arrow 322) represents on-chip circuitry, whereas circuitry to the right of line 320 (as indicated by arrow 324) represents off-chip circuitry. Buffer circuit 208' may include output buffers such as buffers 302 configured to drive output signals Dout off chip 10-1 in direction 306. Buffer circuit 208' may also include input buffers such as buffers 304 configured to receive input signals Din from other off-chip sources in direction 308. Input buffers 304 may have fixed drive strengths and are generally formed using smaller transistors than those found in output buffers 302.

In the example of FIG. 6, buffer circuit 208' includes a first output buffer 302-1, a second output buffer 302-2, a first input buffer 304-1, and a second input buffer 304-2. First output buffer 302-1 may be used for driving output signals with a nominal voltage level (e.g., a core positive power supply voltage level that is used to power the majority of circuits on die 10-1), whereas second output buffer 302-2 may be used for driving output signals with elevated voltage levels (e.g., voltages that are at least 10% greater than the nominal positive power supply voltage). First output buffer 302-1 that is used for driving signals with relatively smaller signal swings may be formed from transistors with thin gate oxide layers while second output buffer 302-2 that is used for driving signals with larger signal magnitudes may be formed from transistors with thick gate oxide layers.

For example, the transistors in first output buffer 302-1 may have gate oxide thicknesses of about 10-14 angstroms and may exhibit a threshold voltage level of 0.25 V, whereas the transistors in second output buffer 302-2 may have gate oxide thicknesses of about 15-30 angstroms and may exhibit a threshold voltage level of 0.45 V (as an example). The use of transistors with thicker oxides may allow the second output buffer to operate reliably, even when subjected to a relatively large range of voltages. The total swing of the output buffers (sometimes referred to as output drivers) is generally limited by oxide reliability limits.

Signal Dout may be provided internally from storage and processing circuitry 200 via path 300 (see, e.g., FIGS. 5 and 6). At least one of output buffers 302 (e.g., buffers 302-1 and 302-2) may be coupled between path 300 and associated microbump 106. Each of output buffers 302-1 and 302-2 may receive control signals Vc via path 206. Control signals Vc may be used to place a corresponding output buffer in an active drive mode or an inactive (tri-state) mode.

Consider a first scenario in which it is desirable to drive output signals at elevated voltage levels off of device 10. As shown in FIG. 6, thick gate oxide output buffer 302-2 may be placed in active drive mode (e.g., by providing output buffer 302-2 with appropriate control signals Vc) while thin gate oxide output buffer 302-1 may be turned off (e.g., by providing output buffer 302-1 with deasserted control signals Vc). In this scenario, it may also be desirable to entirely decouple buffer 302-1 from path 300 and microbump 106 by intentionally leaving terminals A and B of buffer 302-1 disconnected (e.g., no metal path is formed between path 300 and terminal A of buffer 302-1 and between microbump 106 and terminal B of buffer 302-1, as shown by line breaks 309). Decoupling thin gate oxide output buffer 302-1 in this way may help prevent buffer 302 from being exposed to high voltage levels that can potentially damage the thin gate transistors with which output buffer 302-1 is formed.

Consider a second scenario in which it is desirable to drive output signals at nominal voltage levels off of device 10. To accomplish this, thick gate oxide output buffer 302-2 may be turned off (e.g., by providing output buffer 302-2 with deasserted control signals Vc) while thin gate oxide output buffer 302-1 may be placed in active drive mode (e.g., by providing output buffer 301-1 with appropriate control signals Vc). In this scenario, buffer 302-1 may have its terminal A coupled to path 300 via a first metal path and may have its terminal B coupled to microbump 106 via a second metal path (e.g., there is no break 309). Moreover, output buffer 302-2 need not be entirely decoupled using line breaks 309 because thick gate oxide output buffer 302-2 is capable of withstanding a full range of operating voltages. If desired, line breaks 309 can be formed at terminals A and B of output buffer 302-2 to decoupled buffer 302-2.

If microbump 106 is used as an input, both output buffers 301-1 and 302-2 may be disabled (e.g., using line breaks 309 and/or control signals via path 206) to avoid contention with the input signals. First input buffer 304-1 may be used for receiving input signals with a nominal voltage level, whereas second input buffer 304-2 may be used for receiving input output signals with elevated voltage levels. First input buffer 304-1 that is used for receiving signals with relatively smaller signal swings may be formed from transistors with thin gate oxide layers while second input buffer 304-2 that is used for receiving signals with larger signal magnitudes may be formed from transistors with thick gate oxide layers.

Signal Din that is received from off-chip sources may be provided to storage and processing circuitry 200 via path 301 (see, e.g., FIGS. 5 and 6). At least one of input buffers 304 (e.g., buffers 304-1 and 304-2) may be coupled in parallel between path 301 and associated microbump 106 using pass gates. In one suitable embodiment of the present invention, input buffer 304-1 may be coupled to microbump 106 via a first thick gate oxide pass gate 310' (e.g., a pass transistor or transmission gate formed using a thick gate oxide layer) and may be coupled to path 301 via a first thin gate oxide pass gate 310 (e.g., a pass transistor or transmission gate formed using a thin gate oxide layer). Input buffer 304-2 may be coupled to microbump 106 via a second thick gate oxide pass gate 310' and may be coupled to path 301 via a second thin gate oxide pass gate 310. Thin gate oxide pass gates 310 may be powered using nominal power supply voltages, whereas thick gate oxide pass gates 310' may be powered using elevated power supply voltages.

When device 10 is receiving off-chip signals at nominal voltage levels, input buffer 304-1 may be switched into use by selectively activating first pass gate 310' and thin gate oxide pass gate 310 while input buffer 304-2 is switched out of use by turning off second thick gate oxide pass gate 310' and second thin gate oxide pass gates 310. When device 10 is receiving off-chip signals at elevated voltage levels, input buffer 304-1 may be switched out of use by turning off first pass gate 310' and first thin gate oxide pass gate 310 while input buffer 304-2 is switched into use by activating second thick gate oxide pass gate 310' and second thin gate oxide pass gates 310. If desired, pass gates 310 and 310' need not be used if a selected one of input buffers 304 is physically and electrically decoupled from path 301 and microbump 106 using line breaks 309 as described in connection with output buffers 302 (e.g., by leaving one of the input buffers floating and powered down). If microbump 106 is used only as an output port, both input buffers 304-1 and 304-2 may or may not be disabled. Leaving the input buffers activated may not cause contention with signal Dout but may consume power.

The example of FIG. 6 in which input-output buffer circuit 208' includes two output buffers 302 and two input buffers 304 is merely illustrative and does not serve to limit the scope of the present invention. In general, buffer circuit 208' may include any number of output buffers 302 and any number of input buffers, each of which can be selectively switched in and out of use by using pass gates (sometimes referred to as transmission gates) that receive control signals from volatile memory elements (e.g., configuration random-access memory cells, static random-access memory cells, dynamic random-access memory cells, etc.) or nonvolatile memory elements (e.g., fuses, antifuses, electrically-programmable read-only memory elements, etc.), by intentionally not forming particular metal paths during die fabrication procedures, or by the use of other programmable switching mechanisms. If desired, input buffers 304 may similarly be configured to provide adjustable drive strength capability similar to that of output buffers 302. If desired, flip-chip bump input-output buffer circuits 210 may also be configured to provide programmable drive strengths as described in connection with FIG. 6. Flip-chip bump I/O buffers may also be configured to support different I/O standards, such as low-voltage differential signaling (LVDS) and low-voltage positive emitter-coupled logic (LVPECL) I/O standards.

Figure 7:
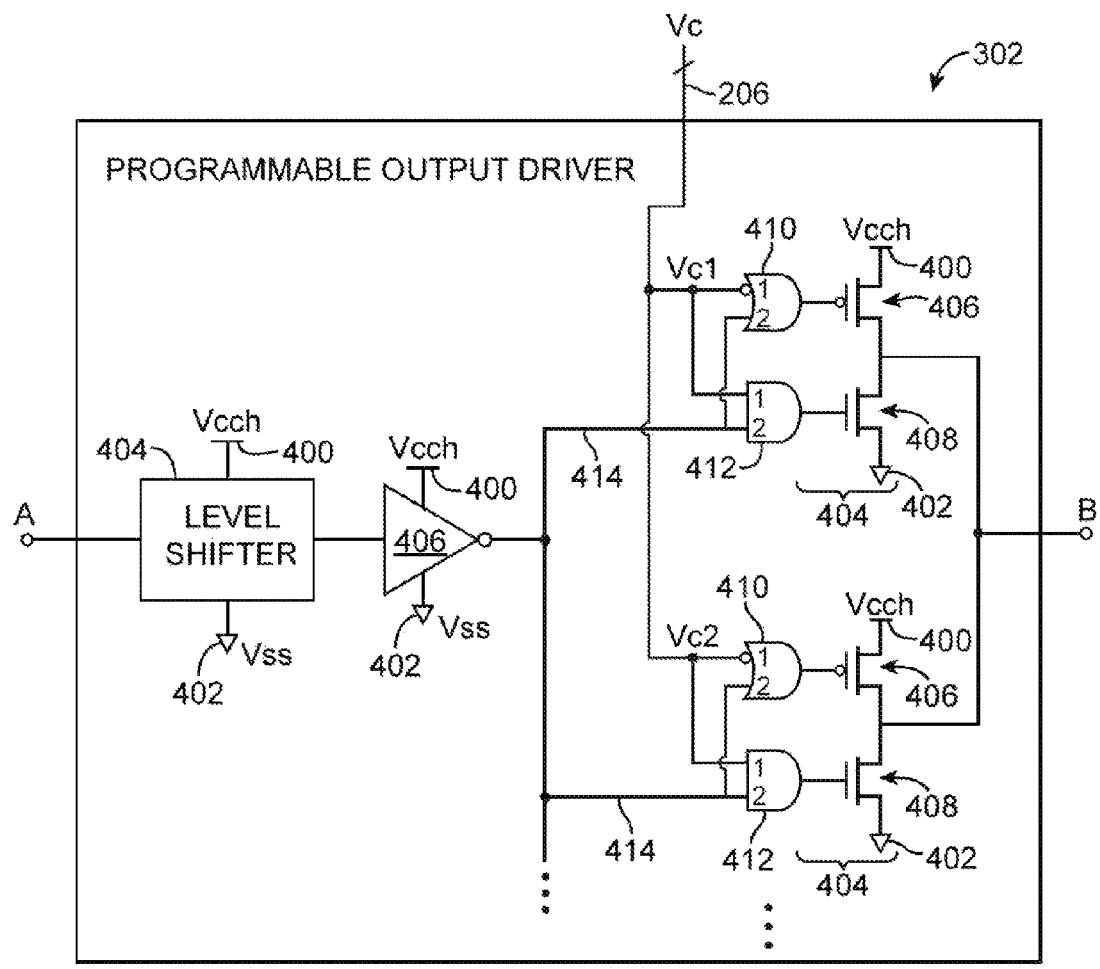
FIG. 7 is a circuit diagram of an illustrative programmable output driver in accordance with an embodiment of the present invention.

The drive strength of output buffer 302 may also be controlled using control signals Vc provided from interface control circuit 204 via path 206. FIG. 7 shows a circuit diagram of programmable output buffer 302. As shown in FIG. 7, output buffer 302 may include a level shifting circuit 404 (sometimes referred to as a level shifter), an inverting buffer 406, first and second logic OR gates 410, first and second logic AND gates 412, and first and second inverter-like circuits 404.

Level shifter 404 and buffer 406 may be coupled in series between input terminal A and path 414. Signal Dout arriving at input terminal A may have nominal voltage levels Vcc that may not be suitably high for being driven off-die. Level shifter 404 and buffer 406 may collectively serve to boost the voltage level of signal Dout from Vcc to Vcch. As an example, voltage Vcc may be equal to 0.8 V while voltage Vcch may be equal to 1.5 V. Level shifter 404 and buffer 406 may therefore be supplied with elevated positive power supply voltage Vcch that is provided over positive power supply line 400 and ground power supply voltage Vss that is provided over ground power supply line 402. Buffer 406 may include an odd number of inverters connected in series, each of which has power supply terminals coupled to power supply lines 400 and 402.

Buffer 406 may have an output that is coupled to path 414. First and second inverter-like circuits 404 may each include a p-channel transistor 406 and an n-channel transistor 408 coupled in series between power supply lines 400 and 402. Each of first and second inverter-like circuits 404 may have an output that is coupled to output terminal B of output buffer 302. Control signals Vc may include at least signal Vc1 that is used for controlling first inverter-like circuit 404 and signal Vc2 that is used for controlling second inverter-like circuit 404.

First logic OR gate 410 may have a first (inverting) input configured to receive control signal Vc1 from path 206, a second (non-inverting) input coupled to path 414, and an output that is coupled to a gate terminal of transistor 406 in first inverter-like circuit 404. First logic AND gate 412 may have a first (non-inverting) input configured to receive Vc1 from path 206, a second (non-inverting) input that is coupled to path 414, and an output that is coupled to a gate terminal of transistor 408 in first inverter-like circuit 404. Second logic OR gate 410 may have a first (inverting) input configured to receive control signal Vc2 from path 206, a second (non-inverting) input coupled to path 414, and an output that is coupled to a gate of transistor 406 in second inverter-like circuit 404. Second logic AND gate 412 may have a first (non-inverting) input configured to receive Vc2 from path 206, a second (non-inverting) input that is coupled to path 414, and an output that is coupled to a gate of transistor 408 in second inverter-like circuit 404.

Configured in this arrangement, first inverter-like circuit 404 may be activated by asserting Vc1 or may be deactivated by deasserting Vc1 (e.g., first circuit 404 may be placed in an active mode by setting Vc1 to a logic "1" or may be placed in a tri-state mode by setting Vc1 to a logic "0"). Similarly, second inverter-like circuit 404 may be activated by asserting Vc2 or may be deactivated by deasserting Vc2 (e.g., second circuit 404 may be switched into use by setting Vc2 to a logic "1" or may be switched out of use by setting Vc2 to a logic "0"). When both first and second inverter-like circuits 404 are in the active mode, circuits 404 are coupled in parallel and may collectively serve to drive Dout to microbump 106 (see, e.g., FIG. 6).

If desired, output buffer 302 may include any number of inverter-like circuits 404, each of which may be selectively switched in or out of use by controlling signals Vc (i.e., by setting Vc1, Vc2, Vc3, . . . , VcN to desired levels when controlling N inverter-like circuits 404). In general, more inverter-like circuits 404 are activated when a larger drive strength is needed for output buffer 302, whereas fewer inverter-like circuits 404 are switched into use when a smaller drive strength is sufficient for output buffer 302. Output buffer 302 configured in this way may therefore sometimes be referred to as an adjustable-strength output buffer circuit or a programmable-strength output buffer circuit.

Figure 8:
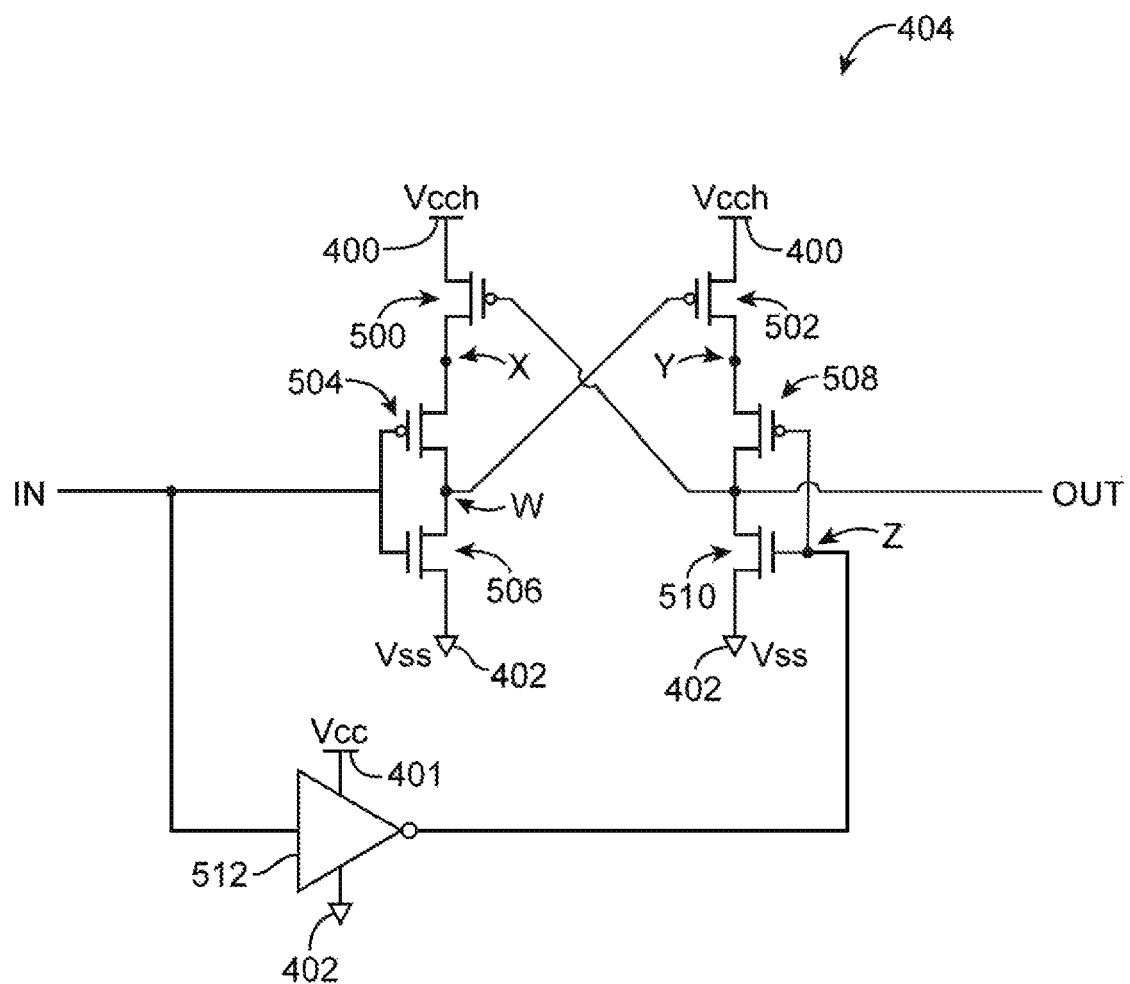
FIG. 8 is a circuit diagram of an illustrative lever shifting circuit in accordance with an embodiment of the present invention.

FIG. 8 is an exemplary circuit diagram of level shifter 404. As shown in FIG. 8, level shifter 404 may include an inverter 512, first p-channel transistor 500, second p-channel transistor 502, third p-channel transistor 504, fourth p-channel transistor 508, first n-channel transistor 506, and second n-channel transistor 510. Transistors 500, 504, and 506 are coupled in series between positive power supply line 400 and ground line 402. Transistors 502, 508, and 510 are coupled in series between positive power supply line 400 and ground line 402. In particular, transistors 504 and 506 may have source-drain terminals connected to a common node W, whereas transistors 508 and 510 may have source-drain terminals connected to a common node OUT (e.g., a node that serves as an output terminal for level shifter 404).

The intermediate node at which transistors 500 and 504 are connected may be referred to herein as node X, whereas the intermediate node at which transistors 502 and 508 are connected may be referred to herein as node Y. Transistors 504 and 506 may each have a gate that is connected to a common node IN (e.g., a node that serves as an input terminal for level shifter 404). Transistors 508 and 510 may each have a gate that is connected to a common node Z. Inverter 512 may have a first power supply terminal is that coupled to power supply line 401 (e.g., a power supply terminal on which nominal positive power supply voltage Vcc is provided), a second power supply terminal that is coupled to ground line 402, an input that is coupled to terminal IN, and an output that is coupled to node Z.

Consider a scenario in which signal Dout pulses high for a given pulse width at input terminal IN of level shifter 402. Initially (when Dout is low), transistors 506 is off, transistors 500 and 504 are in the on state to charge nodes X and W to Vcch, transistors 502 and 508 are off, and transistor 510 is on to discharge OUT to Vss. In response to Dout rising high from Vss to Vcc, transistor 504 is turned off, and transistor 506 is turned on to pull node W towards ground. Transistor 506 will be able to pull W down to Vss because transistor 504 is turned off, thereby breaking any contending pull-up current path. A low node W will then serve to turn on transistor 502 and pull node Y to Vcch. At the same time, inverter 512 will drive node Z low to turn off transistor 510 and to turn on transistor 508. Transistor 508 in the on state will then pull node OUT to Vcch, thereby placing transistor 500 in the off state. Operated in this way, level shifter 404 can therefore be used to elevate or boost the voltage swing of signal Dout.

The circuit implementation of level shifter 404 as described in connection with FIG. 8 is merely illustrate and does not serve to limit the scope of the present invention. If desired, other types of level shifting circuits may be used.

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit within a multi-die package comprising:
    a microbump pad that is coupled to another integrated circuit in the multi-die package;
    a flip-chip bump pad;
    a microbump output buffer circuit that is coupled to the microbump pad, wherein the microbump output buffer circuit has an adjustable drive strength and wherein the microbump output buffer circuit drives output signals to the another integrated circuit;
    a flip-chip bump output buffer circuit that is coupled to the flip-chip bump pad; and
    a control circuit that generates control signals that control the adjustable drive strength of the microbump output buffer circuit.

2. The integrated circuit defined in claim 1, wherein the flip-chip bump output buffer circuit has an adjustable drive strength, and wherein the control circuit further generates control signals that control the adjustable drive strength of the flip-chip bump output buffer circuit.

3. The integrated circuit defined in claim 1, further comprising:
    a microbump input buffer circuit that is coupled to the microbump pad.

4. The integrated circuit defined in claim 1, wherein the microbump output buffer circuit comprises a plurality of output buffers, wherein each output buffer in the plurality of output buffers has a different respective gate oxide thickness.

5. The integrated circuit defined in claim 4 further comprising:
    a microbump input buffer circuit that is coupled to the microbump pad, wherein the microbump input buffer circuit includes a plurality of input buffers, wherein each input buffer in the plurality of input buffers has a different respective gate oxide thickness.

6. The integrated circuit defined in claim 1, wherein the microbump output buffer circuit comprises:
    a plurality of output buffers, wherein each output buffer in the plurality of output buffers has an adjustable drive strength.

7. The integrated circuit defined in claim 6 further comprising:
    a microbump input buffer circuit that is coupled to the microbump pad, wherein the microbump input buffer circuit includes a plurality of input buffers, and wherein each input buffer in the plurality of input buffers has a fixed drive strength.

8. The integrated circuit defined in claim 1, wherein the flip-chip bump pad is larger than the microbump pad.

9. The integrated circuit defined in claim 1, further comprising:
 a through-silicon via that connects the microbump pad to another integrated circuit above the integrated circuit.

10. An integrated circuit comprising:
 a microbump pad;
 a microbump output buffer circuit that is coupled to the microbump pad, wherein the microbump output buffer circuit has a programmable drive strength and wherein the microbump output buffer circuit comprises a plurality of inverter-like circuits coupled between a signal terminal and the microbump pad; and
 a control circuit that generates control signals that control the programmable drive strength of the microbump output buffer circuit by switching individual inverter-like circuits from the plurality of inverter-like circuits in and out of use.

11. The integrated circuit defined in claim 10, further comprising:
 a flip-chip bump pad; and
 a flip-chip bump output buffer circuit that is coupled to the flip-chip bump pad.

12. The integrated circuit defined in claim 10, further comprising:
 an input buffer that receives signals from external circuitry.

13. An integrated circuit comprising:
 an input-output pad;
 an output buffer that is coupled to the input-output pad, wherein the output buffer has adjustable drive strength; and
 a plurality of input buffers that are coupled to the input-output pad, wherein each input buffer of the plurality of input buffers has a respective fixed drive strength, and wherein at least first and second input buffers in the plurality of input buffers have different respective fixed drive strengths; and
 a control circuit that generates control signals for controlling the adjustable drive strength of the output buffer.

14. The integrated circuit defined in claim 13, further comprising:
 a through-silicon via that connects the input-output pad to another integrated circuit above the integrated circuit.

\* \* \* \* \*